(12) United States Patent
Lai et al.

(10) Patent No.: US 7,923,285 B2
(45) Date of Patent: Apr. 12, 2011

(54) METHOD FOR FORMING SELF-ALIGNED THERMAL ISOLATION CELL FOR A VARIABLE RESISTANCE MEMORY ARRAY

(75) Inventors: Erh-Kun Lai, Elmsford, NY (US); ChiaHua Ho, Kaohsiung (TW); Kuang Yeu Hsieh, Hsinchu (TW)

(73) Assignee: Macronix International, Co. Ltd., Hsinchu (TW)

( * ) Notice: Subject to any disclaimer, the term of this patent is extended or adjusted under 35 U.S.C. 154(b) by 0 days.

(21) Appl. No.: 12/351,692

(22) Filed: Jan. 9, 2009

(65) Prior Publication Data
US 2009/0148981 A1 Jun. 11, 2009

Related U.S. Application Data

(62) Division of application No. 11/463,824, filed on Aug. 10, 2006, now Pat. No. 7,531,825.

(60) Provisional application No. 60/754,161, filed on Dec. 27, 2005.

(51) Int. Cl.
*H01L 21/00* (2006.01)
(52) U.S. Cl. .................. 438/102; 257/E45.002
(58) Field of Classification Search .......... 257/2, 3, 257/4, 5, E27.104, E29.17, E45.002; 438/102, 438/95
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |

(Continued)

FOREIGN PATENT DOCUMENTS

| WO | WO-0079539 | 12/2000 |
|---|---|---|
| WO | WO-0145108 | 6/2001 |

OTHER PUBLICATIONS

"Magnetic Bit Boost," www.sciencenews.org, Dec. 18 & 25, 2004, p. 389, vol. 166.

(Continued)

*Primary Examiner* — Sue Purvis
*Assistant Examiner* — Selim Ahmed
(74) *Attorney, Agent, or Firm* — Haynes Beffel & Wolfeld LLP

(57) ABSTRACT

A non-volatile memory with a self-aligned RRAM element includes a lower electrode element, generally planar in form, having an inner contact surface; an upper electrode element, spaced from the lower electrode element; a containment structure extends between the upper electrode element and the lower electrode element, with a sidewall spacer element having a generally funnel-shaped central cavity with a central aperture; and a spandrel element positioned between the sidewall spacer element and the lower electrode. A RRAM element extends between the lower electrode element and the upper electrode, occupying at least a portion of the sidewall spacer element central cavity and projecting from the sidewall spacer terminal edge toward and making contact with the lower electrode. In this manner, the spandrel element inner surface is spaced from the RRAM element to define a thermal isolation cell adjacent the RRAM element.

11 Claims, 5 Drawing Sheets

U.S. PATENT DOCUMENTS

| | | |
|---|---|---|
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,807,786 A | 9/1998 | Chang et al. |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,489,645 B1 | 12/2002 | Uchiyama |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,477 B2 | 8/2003 | Uchiyama |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi |
| 6,815,704 B1 | 11/2004 | Chen |
| 6,830,952 B2 | 12/2004 | Lung et al. |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,029,924 B2 | 4/2006 | Hsu et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |

| | | |
|---|---|---|
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung et al. |
| 7,393,798 B2 | 7/2008 | Campbell |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,449,710 B2 | 11/2008 | Lung |
| 2001/0034078 A1* | 10/2001 | Zahorik et al. .................. 438/95 |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2003/0209746 A1* | 11/2003 | Horii ............................ 257/295 |
| 2003/0224598 A1 | 12/2003 | Lee et al. |
| 2004/0026686 A1 | 2/2004 | Lung |
| 2004/0051094 A1 | 3/2004 | Ooishi |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0037546 A1 | 2/2005 | Yeh et al. |
| 2005/0062087 A1 | 3/2005 | Chen et al. |
| 2005/0093022 A1 | 5/2005 | Lung |
| 2005/0110983 A1 | 5/2005 | Jeong et al. |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2006/0006472 A1 | 1/2006 | Jiang |
| 2006/0038221 A1 | 2/2006 | Lee et al. |
| 2006/0054950 A1 | 3/2006 | Baek et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0194403 A1 | 8/2006 | Li et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1* | 10/2006 | Burr et al. .......................... 257/2 |
| 2006/0226411 A1 | 10/2006 | Lee |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0286762 A1 | 12/2006 | Tseng et al. |
| 2006/0289848 A1 | 12/2006 | Dennison |
| 2007/0008786 A1 | 1/2007 | Scheuerlein |
| 2007/0010054 A1* | 1/2007 | Fan et al. ...................... 438/257 |
| 2007/0030721 A1 | 2/2007 | Segal et al. |
| 2007/0037101 A1 | 2/2007 | Morioka |
| 2007/0072125 A1 | 3/2007 | Sousa et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6, Received on Jan. 9, 2009.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb, " 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%-20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pp.

Yonehara, T. et al., "Control of Grain Boundary Location by Selective Nucleation Over Amorphous Substrates, " Mat. Res. Soc. Symp. Proc., vol. 106, 1998, pp. 21-26.

* cited by examiner

US 7,923,285 B2

METHOD FOR FORMING SELF-ALIGNED THERMAL ISOLATION CELL FOR A VARIABLE RESISTANCE MEMORY ARRAY

REFERENCE TO RELATED APPLICATIONS

This application is a divisional of application Ser. No. 11/463,824 filed on 10 Aug. 2006, which application claims the benefit of U.S. Provisional Patent Application No. 60/754,161, entitled "Method for Forming Self-Aligned Thermal Isolation Cell for a Phase Change Memory Array" filed on 27 Dec. 2005.

BACKGROUND OF THE INVENTION

1. Field of the Invention

The present invention relates to non-volatile memory structures, and more specifically to memory devices employing Resistance Random Access Memory (RRAM) memory elements.

2. Description of Related Art

RRAM based memory materials are widely used in read-write optical disks and non-volatile memory arrays. These materials have at least two solid phases, including for example a generally amorphous solid phase and a generally crystalline solid phase. Laser pulses are used in read-write optical disks to switch between phases and to read the optical properties of the material after the RRAM.

RRAM based memory materials, such as chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the RRAM material cools quickly, quenching the RRAM process, allowing at least a portion of the RRAM structure to stabilize in the amorphous state. It is desirable to minimize the magnitude of the reset current used to cause transition of RRAM material from crystalline state to amorphous state. The magnitude of the reset current needed for reset can be reduced by reducing the size of the RRAM material element in the cell and of the contact area between electrodes and the RRAM material, so that higher current densities are achieved with small absolute current values through the RRAM material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

A non-volatile memory device with a self-aligned RRAM element. The memory device includes a lower electrode element, generally planar in form, having an inner contact surface. At the top of the device is an upper electrode element, spaced from the lower electrode element. A containment structure extends between the upper electrode element and the lower electrode element, and this element includes a sidewall spacer element having an inner surface defining a generally funnel-shaped central cavity, terminating at a terminal edge to define a central aperture; and a spandrel element positioned between the sidewall spacer element and the lower electrode, having an inner surface defining a thermal isolation cell, the spandrel inner walls being spaced radially outward from the sidewall spacer terminal edge, such that the sidewall spacer terminal edge projects radially inward from the spandrel element inner surface. A RRAM element extends between the lower electrode element and the upper electrode, occupying at least a portion of the sidewall spacer element central cavity and projecting from the sidewall spacer terminal edge toward and making contact with the lower electrode. In this manner, the spandrel element inner surface is spaced from the RRAM element to define a thermal isolation cell adjacent the RRAM element.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
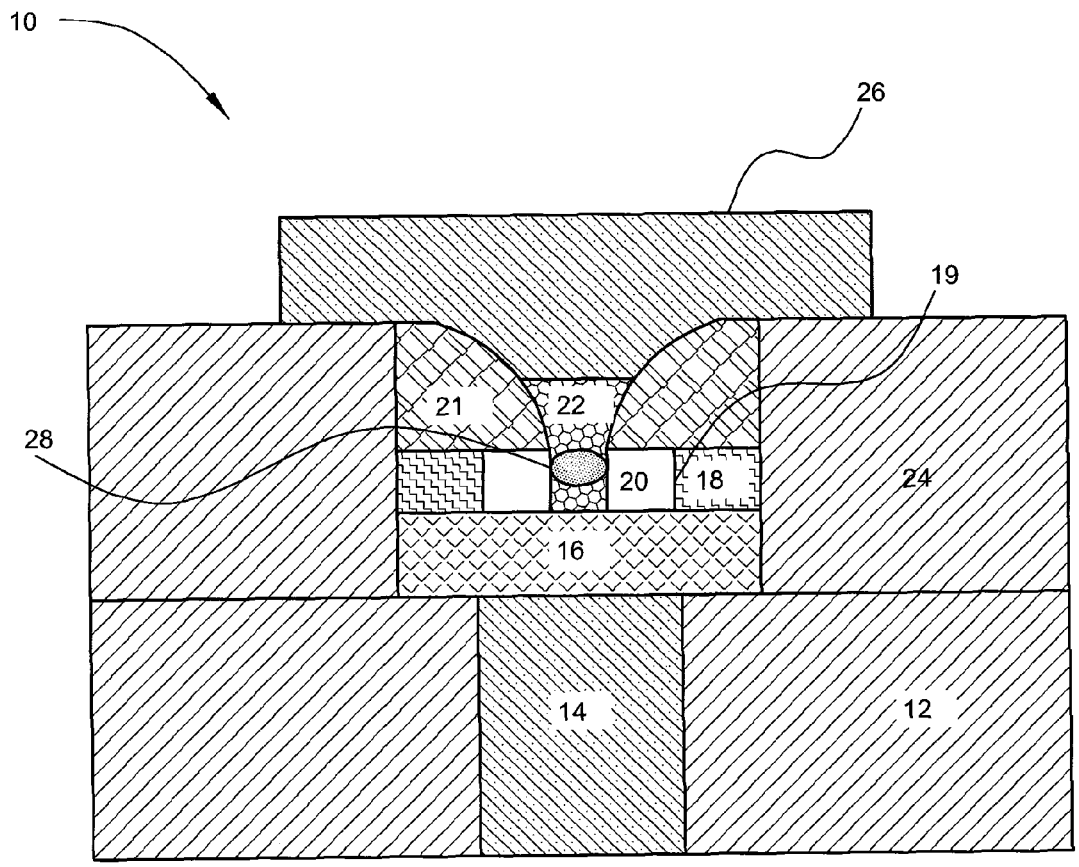
FIG. 1 illustrates an embodiment of a variable resistance memory element as claimed herein.

A memory element 10 is illustrated in FIG. 1. The element is fabricated on a substrate, or inter-layer dielectric layer, 12. The following discussion sets out the structure of this element, with the fabrication process following shortly thereafter. This layer preferably consists of silicon oxide or a well-known alternative thereto, such as a polyimide, silicon nitride or other dielectric fill material. In embodiments, the dielectric layer comprises a relatively good insulator for heat as well as for electricity, providing thermal and electrical isolation. An electrical contact, or plug, 14, preferably formed from a refractory metal such as tungsten, is formed in the oxide layer. Other refractory metals include Ti, Mo, Al, Ta, Cu, Pt, Ir, La, Ni, and Ru. The plug element makes electrical contact with an isolation or switching device, such as a transistor, located below the dielectric layer 12, as is known in the art. Other circuit components preferably located below the illustrated RRAM element include the common source lines and word lines, both of which are well-known in the memory art.

It should be noted that, for purposes of reference only, the direction from the bottom toward the top of the drawings herein is designated "vertical", and the side-to-side direction is "lateral" or "horizontal." Thus, "width" denotes a dimension parallel to the horizontal direction in the drawings, and "height" or "thickness" denotes a dimension parallel to the vertical. Such designations have no effect on the actual physical orientation of a device, either during fabrication or during use.

An lower electrode element 16 is formed atop the plug element 14. The lower electrode is preferably generally tabular in form and can be slightly wider than the plug element. It is formed from a metal such as copper, but other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the lower electrodes may be TiAlN or TaAlN, or may comprise, for further examples, one or more elements selected from the group consisting of Ti, W, Mo, Al, Ta, Cu, Pt, Ir, La, Ni, and Ru and alloys thereof.

A spandrel element 18 is formed on the lower electrode element. As will be understood better in considering the spandrel element in the context of the embodiment as a whole, the material of which this element is composed will depend on choices made for adjacent layers. In general it can be said that that the overall criteria for this element are that it first function effectively as a spandrel in the environment of a memory device, and second that it offer the possibility of a highly selective etching process, as described below. Thus, the material to be employed here depends upon the materials chosen for the lower electrode element 16, discussed above, and the sidewall spacer element 21, discussed above. If, for example, the lower electrode element is composed of TiN, as is preferable, then suitable materials for the spandrel element could be W or Al or SiN, all of which offer the possibility of a high differential etch rate, as discussed below.

Figure 1A:
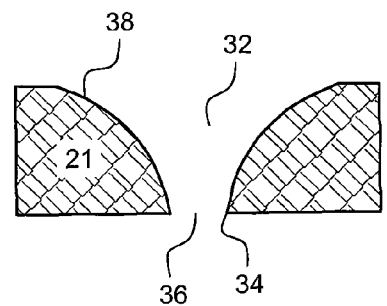
FIG. 1a depicts the sidewall portion of the embodiment of FIG. 1.

Sidewall spacer element 21 lies above and in contact with the spandrel element. This element is relatively thick compared with the lower electrode and spandrel, but it is coextensive with those elements in width. FIG. 1a is a detailed view of the sidewall spacer element, allowing its structure to be viewed more clearly. As can be seen there, the sidewall spacer element has a central cavity 32, generally funnel-shaped in form, with inner sides 38 of the sidewall spacer having a convex profile. The inner sides intersect with the bottom of the sidewall spacer to form terminal edges 34, which in turn define a central aperture 36. The sidewall spacer element is formed from a dielectric fill material.

As shown in FIG. 1, a portion of the sidewall spacer central cavity is filled with a RRAM element 22. This element fills the lower portion of the central cavity and extends downward to make contact with the lower electrode element.

The phase-change element 22 is formed from a material that can assume at least two stable resistance levels, referred to as resistance random access memory (RRAM) material. Several materials have proved useful in fabricating RRAM, as described below.

An important class of RRAM material is the chalcogenide group. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Because chalcogenides achieve their dual-memory capabilities by forming two solid phases, each of which exhibits a characteristic resistance, these materials are referred to as "RRAM" materials or alloys.

Many RRAM based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge-Sb-Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a RRAM alloy that has programmable resistive properties. Specific examples of memory materials that may be useful are given in Ovshinsky '112 at columns 11-13, which examples are hereby incorporated by reference.

RRAM alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, RRAM materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

RRAM alloys can be changed from one phase state to another by application of electrical pulses. It has been observed that a shorter, higher amplitude pulse tends to change the RRAM material to a generally amorphous state. A longer, lower amplitude pulse tends to change the RRAM material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular RRAM alloy. In following sections of the disclosure, the RRAM material is referred to as GST, and it will be understood that other types of RRAM materials can be used. A material useful for implementation of a PCRAM described herein is $Ge_2Sb_2Te_5$.

Other programmable resistive memory materials may be used in other embodiments of the invention. One such material is a colossal magnetoresistance (CMR) material, which dramatically change resistance levels in the presence of a magnetic field. Such materials are generally manganese-based perovskite oxides, and the resistance changes encountered are generally in the range of orders of magnitude. A preferred formulation for RRAM applications is $Pr_xCa_yMnO_3$, where x:y=0.5:0.5, or other compositions in which x:0~1; y:0~1. Other CMR materials including an Mn oxide can also be employed.

Another RRAM material is a 2-element compound, such as $Ni_xO_y$; $Ti_xO_y$; $Al_xO_y$; $W_xO_y$; $Zn_xO_y$; $Zr_xO_y$; $Cu_xO_y$, where x:y=0.5:0.5. Alternatively, another compound in this group could be employed, in which x:0~1; y:0~1. Also, polymers employing dopants such as Cu, C60, Ag can be employed, including 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

Here the relationship between the sidewall spacer element, the RRAM element, the spandrel element and the lower electrode element should be noted. The spandrel element lies between the lower electrode and sidewall spacer elements, but the inner edges 19 of the spandrel element do not extend to make contact with the lower portion of the RRAM element. Rather, the spandrel inner edges are recessed from the sidewall spacer element terminal edges, so that the sidewall spacer, spandrel, lower electrode and RRAM elements enclose a void surrounding the RRAM element, thermal isolation cell 20. The spandrel element is surrounded by an inter-metal dielectric layer 24, which is preferably a dielectric fill material, such as SiO2.

Upper electrode element 26 lies on the sidewall spacer element, and a portion of the upper electrode extends into the central cavity to make electrical contact with RRAM element 22. This element is preferably formed from TiN or similar material, as discussed above. This electrode provides contact with other circuit elements, and in one embodiment it is in direct electrical contact a bit line (not shown).

Operation of the embodiment of FIG. 1 proceeds as follows. As noted above, the memory element 10 stores a data bit by altering the solid phase of RRAM element 22, causing the electrical resistance of that device to change as well. In its crystalline phase state, the RRAM element has a relatively low electrical resistance, while in the amorphous state its resistance is relatively high. Thus, one state can be chosen to represent a logical one and the other a logical zero, also referred to in the art as "high" and "low" logic levels. Thus, two signals are required to set the device state, a SET signal and one for RESET, chosen to produce the desired RRAM in the element. In one embodiment, the default level for the device is chosen to be the logical zero, or low, which is chosen to correspond to the high resistance (amorphous) state. Thus, the RESET signal is chosen as appropriate to produce the amorphous state. The SET signal, to produce the logic one level, is likewise chosen to produce the crystalline state. One other operation must be provided for, to sense a present level of the device in a READ operation. That signal is chosen below the level that will produce any RRAM.

These signals are generally initiated in control circuitry (not shown) which communicates with the circuitry immediately concerned with the memory element shown. In one embodiment such initiation proceeds by energizing the word line associated with the transistor controlling the element, turning that transistor on so that current flows through the transistor to plug element 14 and then through lower electrode 16, RRAM element 22 and upper electrode 26 and out to the bit line (not shown). That high current density in the most narrow area 28 of RRAM element 22 produces joule heating, which in turn leads to RRAM. The area 28 is by design located in the area of thermal isolation cell 20.

An embodiment of the process for fabricating the memory element of FIG. 1 is shown in FIGS. 2a-2h. Discussions above on the materials employed will not be repeated here.

Figure 2A:
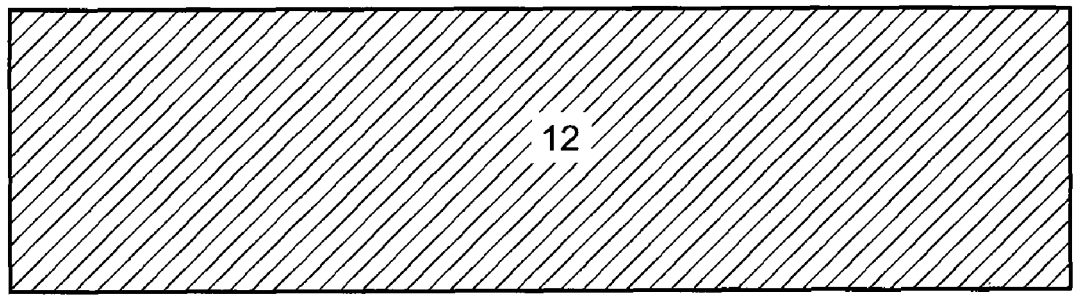
FIGS. 2a-2h illustrate an embodiment of a process for fabricating the embodiment of FIG. 1.
Figure 2B:
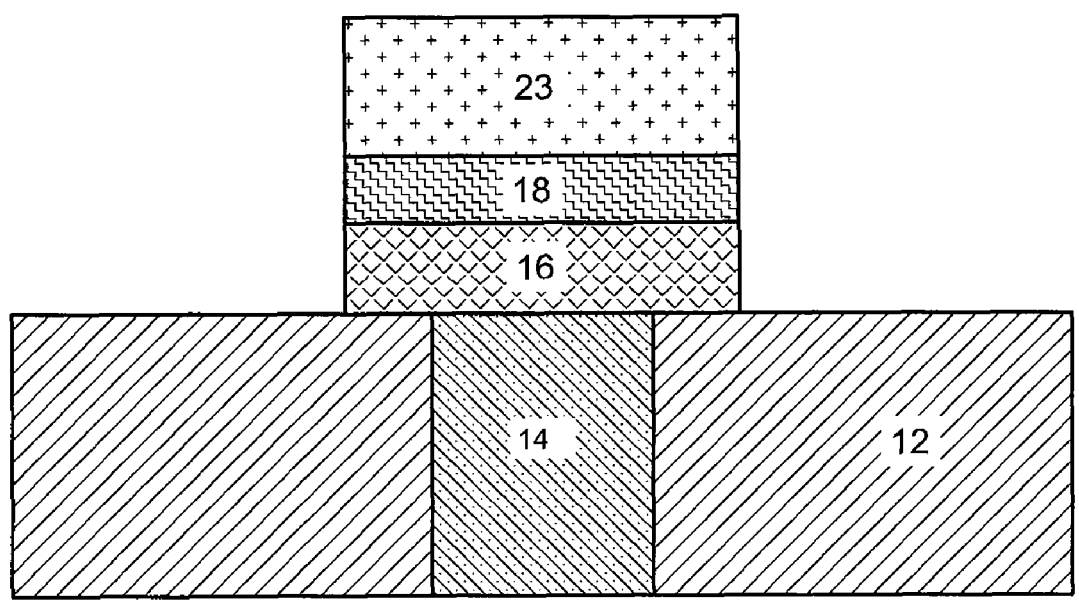

The process begins with deposition of the substrate, or inter-layer dielectric (ILD) 12, as depicted in FIG. 2a. Next, the plug element 14 is formed through the ILD, preferably by lithographically etching the opening and depositing the electrode material, followed by planarizing the ILD to remove any excess electrode material. Then three layers are deposited in succession—an electrode layer 16, a spandrel layer 18 and a sacrificial layer 23. Deposition of these layers can proceed as known in the art. The sacrificial layer 23 is preferably composed of silicon nitride, primarily for its ability to be preferentially etched in comparison with silicon dioxide. Following deposition, the width of these three layers is trimmed to a desired value, preferably employing conventional lithographic and etching methods.

Figure 2C:
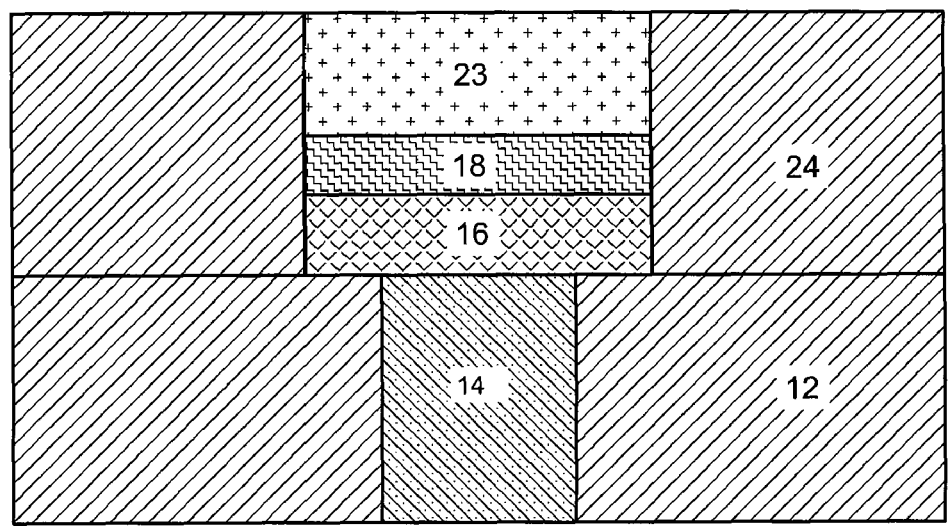
Figure 2D:
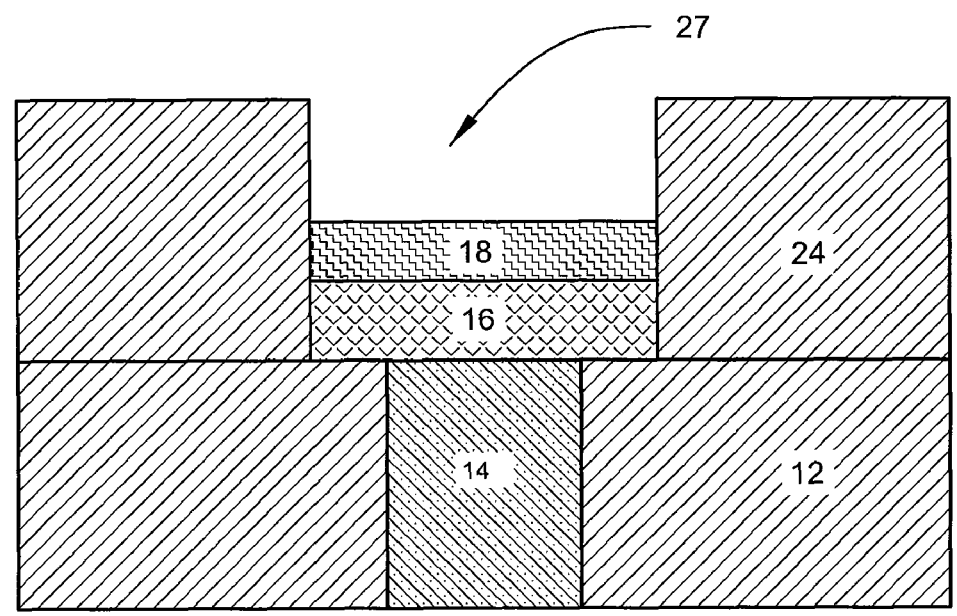

Next, as seen in FIG. 2c, an inter-metal dielectric layer (IMD) 24 is deposited or grown on the ILD, surrounding the trimmed layers. This layer is composed of suitable dielectric fill material, as discussed above. A planarization process, such as chemical-mechanical polishing (CMP) is employed to reduce the thickness of the newly-formed dielectric layer to a desired thickness, exposing the nitride layer 23. Next, as seen in FIG. 2d, the nitride layer is removed, leaving a void 27 in the upper surface of the IMD.

Figure 2E:
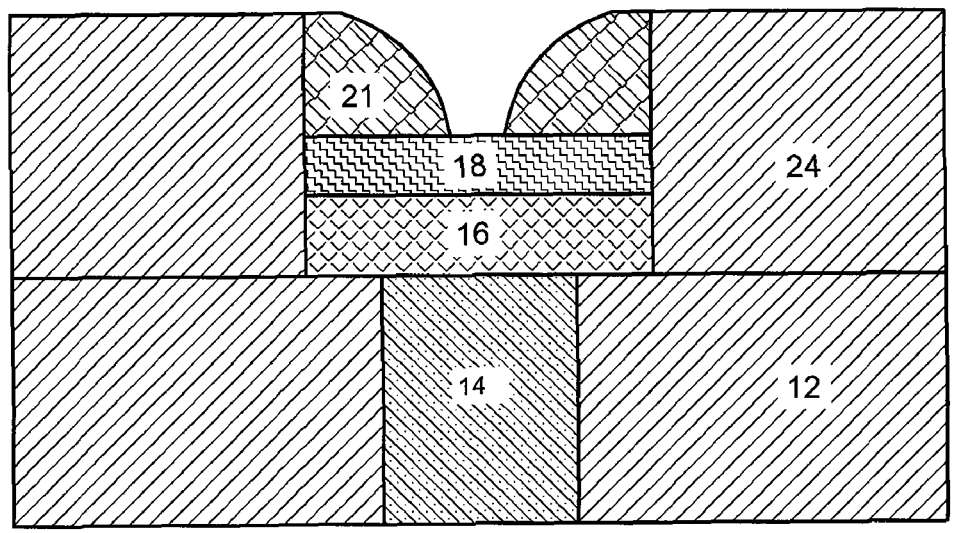

FIG. 2e depicts the initial formation of sidewall spacer 21, which is formed by deposition followed by etching, to produce a structure having a profile with convex sides of increasing thickness from top to bottom. Those in the art will understand that a number of known processes exist to accomplish this step, including the technique of sidewall spacer patterning. To accomplish that result, a layer of suitable material, such as an oxide dielectric material, is deposited on the structure shown in FIG. 2d. That material is then anisotropically etched to remove all material down to the level of the IMD 24, leaving a sidewall spacer 21 having sloping walls and a funnel-shaped central cavity 32, as discussed above. The etchant for this process is dependent on the exact materials, but assuming the spandrel 18 is W, then the preferred etchant for the oxide material is $CHF_3/CHF_4$ or $CH_3F/CHF_4$. either of those choices is highly selective for the oxide over the tungsten material.

Figure 2F:
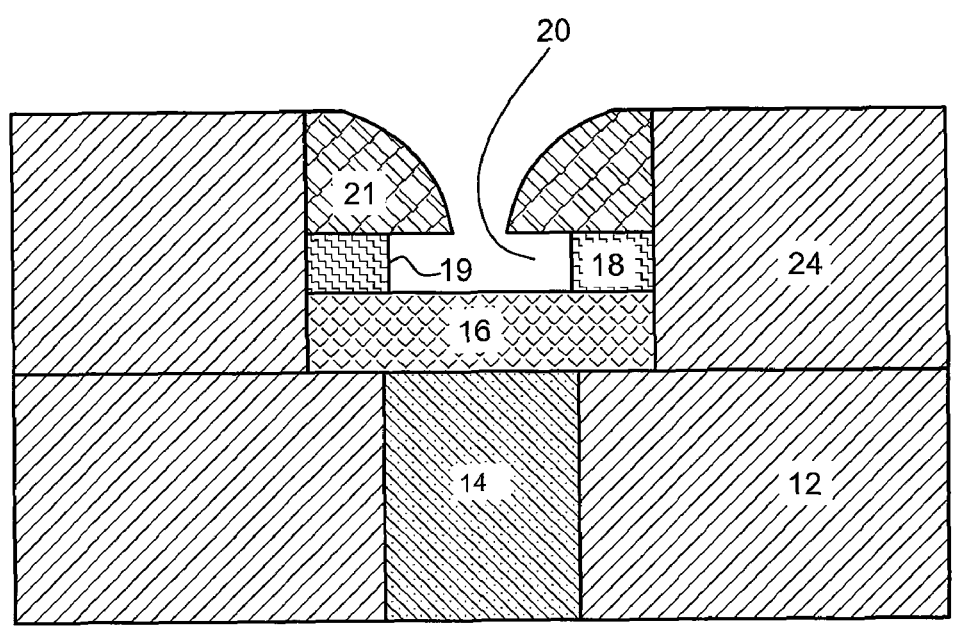

In the next step, the thermal isolation cell is formed, as shown in FIG. 2f. Preferably, this etching step is performed via a plasma etch, using a no-bias, isotropic process. Here the preferred etchant is $SF_6/O_2$, which will etch the oxide and TiN layers at a significantly slower rate than the W material of the spandrel. Of course, different materials will require a change in the etch material recipe.

The etchant acts selectively on the spandrel, leaving the sidewall spacer and underlying electrode relatively unaffected. The result is that the spandrel element is removed altogether in its central portion, with inner edges 19 substantially recessed from the central opening of the sidewall spacer.

Figure 2G:
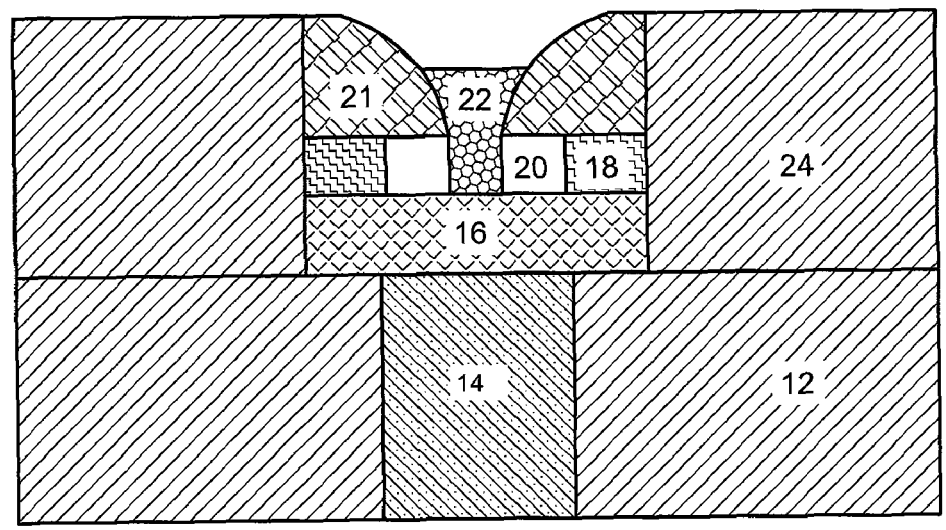

Next, in FIG. 2g, the RRAM element 22 is added, preferably by a deposition process. Here it is preferred to carry out the deposition with a sputtering process, which will produce a more conformal coating. Owing to the inward-sloping shape of the sidewall spacer, and its central opening, deposited GST material accumulates on the upper surface of electrode 16, building upward until it reaches the level of the sidewall spacer central opening, and thereafter the GST material proceeds to fill the sidewall spacer central cavity. It is preferred to continue the GST deposition until the sidewall spacer is filled, which also produces a layer of GST material on the ILD layer. A selective etching step is then undertaken, which removes all GST material on the ILD layer. In one embodiment, the etch is continued until the GST material is recessed into the sidewall spacer central cavity, as shown in FIG. 2g. This measure is preferred in order to ensure good contact between the RRAM element and the succeeding layer, as explained below. After this step, the RRAM element 22 is a flared shape, with its narrow end in contact with electrode 16. As a further consequence of the operations on the sidewall spacer, the RRAM element is self-aligned in the cell, centered on the electrode. Also, it is desirable that the narrowest segment of the RRAM element be just below the terminal edge of the sidewall spacer, and the sidewall spacer geometry can be designed to provide that result, as shown.

Figure 2H:
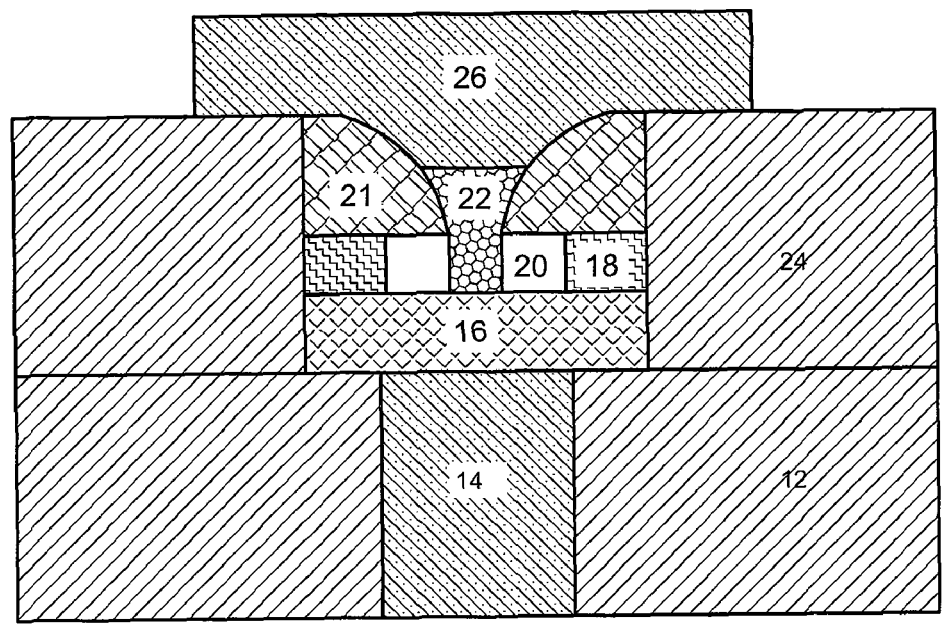

The final step is shown in FIG. 2h, in which the upper electrode 26 is deposited. This element, formed of TiN, as discussed above, is deposited, according to methods known in the art, so that material fills the remainder of the sidewall spacer, making contact with the RRAM element, and then forms a layer atop the ILD. The layer is reduced to a desired thickness, preferably using a CMP process, and then lithographically trimmed to a desired width, with the result as shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of fabricating a memory device, comprising:
providing a bottom electrode;
forming a dielectric element over the bottom electrode;
forming a via in the dielectric element;
forming a spacer element and a memory element in the via; and
forming a top electrode over the memory element;
wherein there is an opening between the memory element and the spacer element within the via.

2. The method of claim 1, wherein forming the via is by etching the dielectric element.

3. The method of claim 1, wherein forming the spacer dielectric element and the memory element is by a depositing process.

4. A method of fabricating a memory device, comprising:
providing a dielectric layer;
etching the dielectric layer to form a via;
forming a first electrode in the via;
depositing a sidewall element in the via;
depositing a memory element over the sidewall element; and
forming a second electrode over the memory element;
wherein the sidewall element is spaced away from the first electrode having inner surface which with a top surface of the bottom electrode defines an opening within the via on the first electrode.

5. A method of fabricating a memory device, comprising the steps of:
providing a substrate of insulating material;
depositing successively a lower electrode layer, a spandrel layer and a sacrificial layer on the substrate, trimming those layers to form a lower electrode element, a spandrel element and a sacrificial element, and depositing an insulating layer to enclose and surround the same;
etching the sacrificial element to form a void over the lower electrode element and spandrel element in the insulating layer surface;
forming a sidewall spacer element having a generally funnel-shaped opening in the void, having a terminal edge at the bottom of the opening, thereby exposing the spandrel layer;
selectively isotropically etching the spandrel element to extend the opening through the spandrel element to the lower electrode, such that a spandrel element inner surface is defined, recessed from the terminal edge of the sidewall spacer element;
depositing a programmable resistive material into the opening, such that a portion of the programmable resistive material is in contact with the sidewall spacer element inner surface and a portion extends from the sidewall spacer element terminal edge to make contact with the lower electrode; and
forming an upper electrode in contact with the programmable resistive material;
whereby the spandrel element inner surface and the programmable resistive material define a thermal isolation cell.

6. The method of claim 5, wherein the programmable resistive material comprises a combination of Ge, Sb, and Te.

7. The method of claim 5, wherein the programmable resistive material comprises a combination of two or more materials from the group of Ge, Sb, Te, Se, In, Ti, Ga, Bi, Sn, Cu, Pd, Pb, Ag, S, and Au.

8. The method of claim 5, wherein the programmable resistive material exhibits variable resistance, such variability being associated with changes in phase structure.

9. The method of claim 5, wherein the spandrel element is composed of a material exhibiting high preferential etch properties relative to the sidewall spacer and lower electrode elements.

10. The method of claim 5, wherein the spandrel element is composed of tungsten, the sidewall spacer element is composed of a dielectric fill oxide, and the lower electrode is composed of TiN.

11. The method of claim 5, wherein the upper electrode element extends into and partially fills the central cavity, making contact therein with the programmable resistive material.

* * * * *